US010734258B2

(12) United States Patent
Han et al.

(10) Patent No.: US 10,734,258 B2
(45) Date of Patent: Aug. 4, 2020

(54) UNDERFILL SOLUTION SUPPLYING DEVICE FOR A DISPENSER, DISPENSER INCLUDING THE SAME, AND METHOD OF MANUFACTURING A SEMICONDUCTOR MODULE USING THE SAME

(71) Applicant: Samsung Electronics Co., Ltd., Suwon-si (KR)

(72) Inventors: Seong-Chan Han, Cheonan-si (KR); Young-Rock Lee, Asan-si (KR); Han-Ju Kim, Asan-si (KR); Hun Han, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/181,570

(22) Filed: Nov. 6, 2018

(65) Prior Publication Data
US 2019/0228996 A1 Jul. 25, 2019

(30) Foreign Application Priority Data
Jan. 22, 2018 (KR) ........................ 10-2018-0007584

(51) Int. Cl.
*B05C 5/02* (2006.01)
*B05C 11/10* (2006.01)
(Continued)

(52) U.S. Cl.
CPC ...... *H01L 21/67126* (2013.01); *H01L 21/563* (2013.01); *H01L 24/73* (2013.01);
(Continued)

(58) Field of Classification Search
CPC .................................................. H01L 21/6715
See application file for complete search history.

(56) References Cited

U.S. PATENT DOCUMENTS 6,206,066 B1 3/2001 Imanishi et al.
7,213,739 B2 5/2007 Wilson et al.
(Continued)

FOREIGN PATENT DOCUMENTS

JP 2001-053411 A 2/2001
KR 10-0436155 B1 6/2004
(Continued)

*Primary Examiner* — Moazzam Hossain
(74) *Attorney, Agent, or Firm* — Muir Patent Law, PLLC

(57) ABSTRACT

A dispenser includes a syringe container having a first end and a second end, the syringe container having a length direction extending between the first end and the second end, a plunger movable within the syringe container along the length direction of the syringe container and configured to be positioned on a surface of an underfill solution to be received within the syringe container at a first region between the plunger and the second end, a cap attached airtightly to the first end of the syringe container, a first gas supply line configured to supply a first gas into the syringe container through the cap, and a second gas supply line extending from the cap to the plunger, the second gas supply line being in fluid communication with the first region and configured to supply a second gas into the underfill solution to be received within the syringe container at the first region through a through hole of the plunger.

17 Claims, 10 Drawing Sheets

(51) Int. Cl.
  *B05C 11/11* (2006.01)
  *B05C 17/005* (2006.01)
  *B05C 17/015* (2006.01)
  *H01L 21/67* (2006.01)
  *H01L 23/00* (2006.01)
  *H01L 21/56* (2006.01)
  *H01L 25/18* (2006.01)

(52) U.S. Cl.
  CPC .... *H01L 25/18* (2013.01); *H01L 2224/73204* (2013.01); *H01L 2924/3512* (2013.01)

(56) References Cited

U.S. PATENT DOCUMENTS

| | | |
|---|---|---|
| 8,684,718 B2 | 4/2014 | Yamada et al. |
| 9,501,067 B2 | 11/2016 | Vega et al. |
| 2005/0150449 A1* | 7/2005 | Matsunaga ............. B05B 9/005 118/300 |
| 2010/0176161 A1* | 7/2010 | Conner ................. B05C 5/0212 222/389 |
| 2012/0104033 A1* | 5/2012 | MacIndoe ................. B05B 9/04 222/389 |
| 2014/0263468 A1* | 9/2014 | Conner ............. B65D 83/0005 222/389 |
| 2015/0360929 A1 | 12/2015 | O'Dougherty et al. |
| 2016/0193619 A1* | 7/2016 | des Jardins ........... B05B 12/087 222/1 |
| 2016/0361734 A1* | 12/2016 | Routen ................. B05C 17/015 |
| 2018/0297054 A1* | 10/2018 | Mizoguchi ........ B05C 17/00576 |

FOREIGN PATENT DOCUMENTS

| | | |
|---|---|---|
| KR | 10-1418310 B1 | 7/2014 |
| KR | 10-2016-0053165 A | 5/2016 |

\* cited by examiner

UNDERFILL SOLUTION SUPPLYING DEVICE FOR A DISPENSER, DISPENSER INCLUDING THE SAME, AND METHOD OF MANUFACTURING A SEMICONDUCTOR MODULE USING THE SAME

PRIORITY STATEMENT

This application claims priority under 35 U.S.C. § 119 to Korean Patent Application No. 10-2018-0007584, filed on Jan. 22, 2018 in the Korean Intellectual Property Office (KIPO), the contents of which are herein incorporated by reference in their entirety.

BACKGROUND

1. Field

Example embodiments relate to an underfill solution supplying device for a dispenser, a dispenser including the same, and a method of manufacturing a semiconductor module using the same. For example, example embodiments relate to an underfill solution supplying device for supplying an underfill solution to a pumping device of a dispenser, a dispenser including the same, and a method of manufacturing a semiconductor module using the same.

2. Description of the Related Art

In order to improve mechanical properties of a memory module such as solid state drive (SSD), an epoxy resin based underfill solution may be dispensed between an electronic product and a printed circuit board to form a sealing member. However, a difference of coefficient of thermal expansion between the electronic product, the printed circuit board and the sealing member may deteriorate temperature cycle (TC) reliability.

SUMMARY

Example embodiments provide an underfill solution supplying device of a dispenser capable of improving temperature cycle reliability in an underfill process.

Example embodiments provide a dispenser including the underfill solution supplying device.

Example embodiments provide a method of manufacturing a semiconductor module using the underfill solution supplying device.

According to example embodiments, a dispenser includes a syringe container a first end and a second end, the syringe container having a length direction extending between the first end and the second end, a plunger movable within the syringe container along a length direction of the syringe container and configured to be positioned on a surface of an underfill solution to be received within the syringe container at a first region between the plunger and the second end, a cap attached airtightly to the first end of the syringe container, a first gas supply line configured to supply a first gas into the syringe container through the cap, and a second gas supply line extending from the cap to the plunger, the second gas supply line being in fluid communication with the first region and configured to supply a second gas into the underfill solution to be received within the syringe container at the first region through a through hole of the plunger.

According to example embodiments, a dispenser includes a syringe container configured to receive an underfill solution, a plunger movable within the syringe container along a length direction of the syringe container and configured to pressurize the underfill solution to be received within the syringe container at a first region, a cap attached airtightly to a first end of the syringe container, and a first gas supply line extending to the plunger through the cap, the first gas supply line being in fluid communication with the first region and configured to supply a first gas for bubble formation into the underfill solution to be received within the syringe container at the first region through a through hole of the plunger According to example embodiments, a dispenser includes a pump configured to dispense an underfill solution through a dispenser nozzle and an underfill solution supplying device configured to supply the underfill solution to the pump through a fluid supply line. The underfill solution supplying device includes a syringe container configured to receive the underfill solution, a plunger movable within the syringe container along a length direction of the syringe container and capable of pressurizing the underfill solution, a cap attached airtightly to a first end of the syringe container, a first gas supply line configured to supply a first gas into the syringe container through the cap, and a second gas supply line extending to the plunger through the cap, the second gas supply line being in fluid communication with a first region and configured to supply a second gas into the underfill solution to be received within the syringe container at the first region through a through hole of the plunger.

According to example embodiments, in a method of manufacturing a semiconductor device, an underfill solution is supplied into a syringe container. A gas is introduced into the underfill solution through a through hole of a plunger. The underfill solution is pressurized with the plunger. The underfill solution having the gas therein is supplied to a pumping device. The underfill solution is dispensed to a semiconductor device using the pumping device.

According to example embodiments, an underfill solution supplying device may supply an underfill solution having air bubbles trapped therein to a pumping device. The underfill solution may be dispensed through a dispenser nozzle of the pumping device.

When the underfill solution is cured to form a sealing member, the air dissolved in the underfill solution may form a void within the sealing member under atmospheric pressure. The void may prevent a progress of a crack generated by a difference of coefficient of thermal expansion (CTE) of the sealing member, to thereby improve temperature cycle (TC) reliability.

BRIEF DESCRIPTION OF THE DRAWINGS

Example embodiments will be more clearly understood from the following detailed description taken in conjunction with the accompanying drawings.

FIGS. 1 to 10 represent non-limiting, example embodiments as described herein.

FIG. 1 is a block diagram illustrating a dispenser system in accordance with example embodiments.

FIG. 2 is a side view illustrating an underfill solution supplying device of a dispenser in FIG. 1.

FIG. 3 is a perspective view illustrating a plunger of the underfill solution supplying device of FIG. 2.

FIG. 5 is a flow chart illustrating a method of manufacturing a semiconductor module in accordance with example embodiments.

FIGS. 6 to 9 are views illustrating a method of manufacturing a semiconductor module in accordance with example embodiments.

FIG. 10 is an enlarged view illustrating "A" portion in FIG. 9.

DETAILED DESCRIPTION

Hereinafter, example embodiments will be explained in detail with reference to the accompanying drawings.

Figure 1:
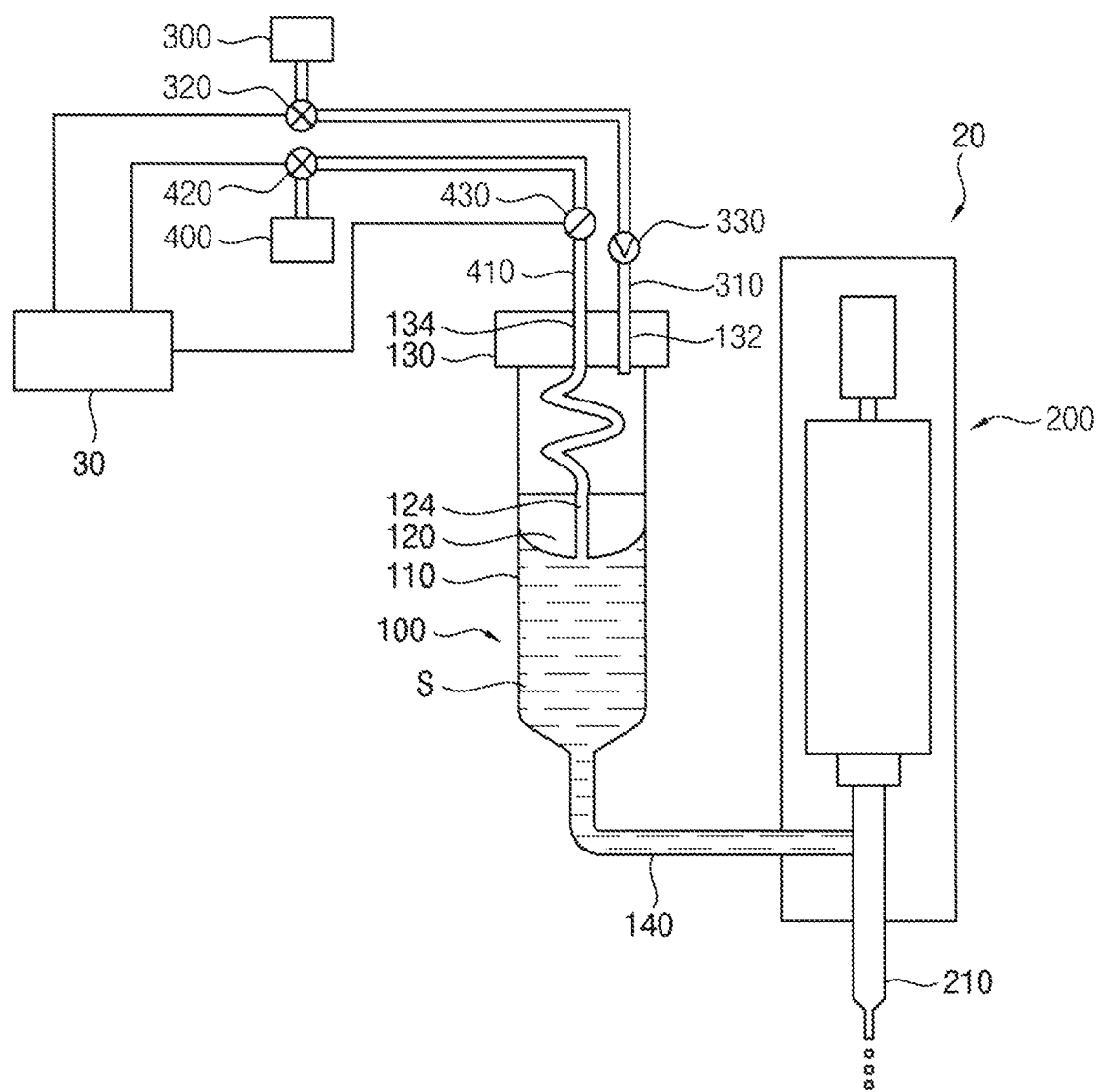
Figure 2:
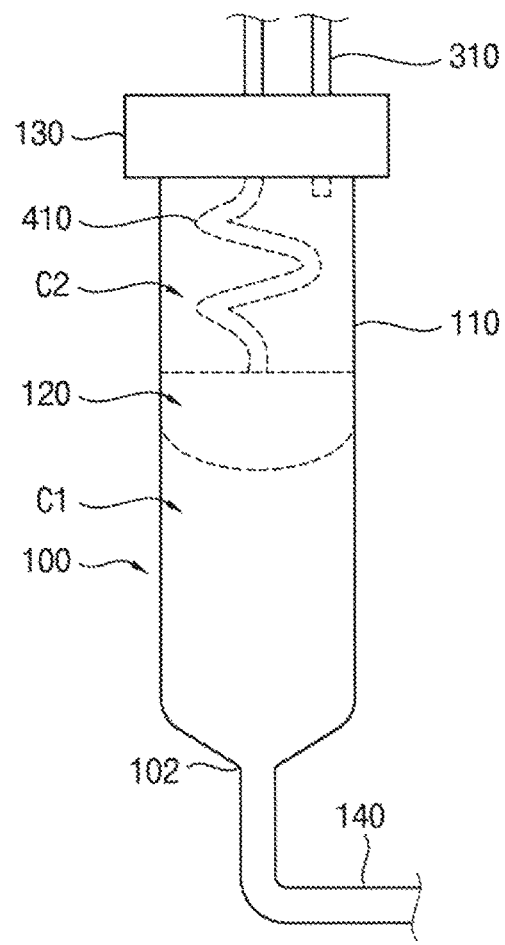
Figure 3:
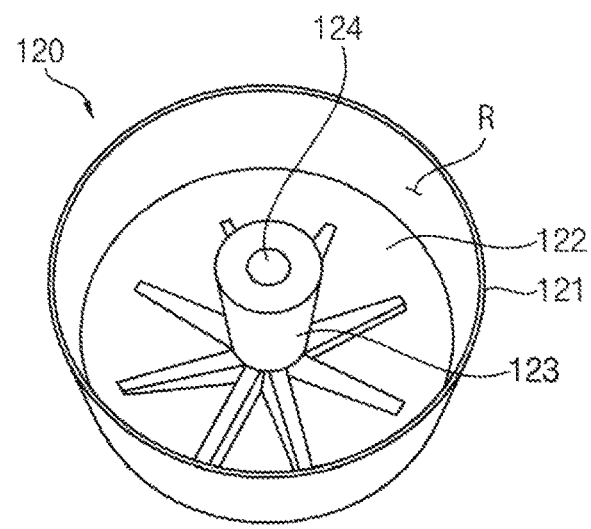
Figure 4A:
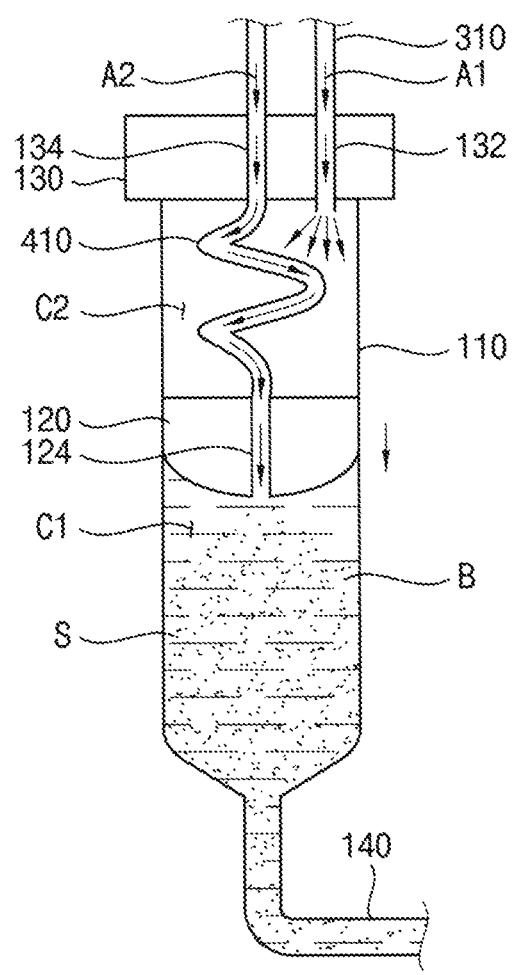
FIGS. 4A and 4B are views illustrating supplying of a first gas for plunger pressurization and a second gas for bubble formation in a syringe container in FIG. 2.
Figure 4B:
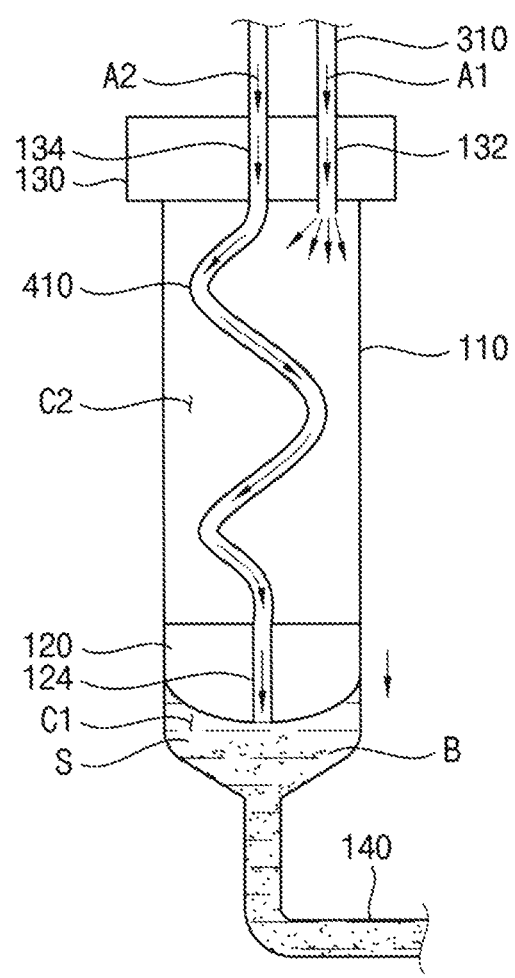

FIG. 1 is a block diagram illustrating a dispenser system in accordance with example embodiments. FIG. 2 is a side view illustrating an underfill solution supplying device of a dispenser in FIG. 1. FIG. 3 is a perspective view illustrating a plunger of the underfill solution supplying device of FIG. 2. FIGS. 4A and 4B are views illustrating supplying of a first gas for plunger pressurization and a second gas for bubble formation in a syringe container in FIG. 2.

Referring to FIGS. 1 to 4B, a dispenser system 10 may include a dispenser 20 configured to dispense an underfill solution S and a controller 30 configured to control operations of the dispenser 20.

In example embodiments, the dispenser 20 may dispense small quantities of viscous fluids such as underfill solution S. The dispenser 20 may be used for an underfill process where the underfill solution S is dispensed under an electronic device disposed on a printed circuit board. The underfill solution S may include epoxy resin. For example, the underfill solution S may be dispensed between an electronic device and a package substrate on which the electronic device is mounted. In certain embodiments, the underfill solution S may be dispensed between a package substrate on which an electronic device is mounted and a module board on which the package substrate is mounted.

As illustrated in FIG. 1, the dispenser 20 may include an underfill solution supplying device 100 supplying the underfill solution S and a pumping device 200 dispensing the underfill solution S supplied from the underfill solution supplying device 100 through a dispenser nozzle 210. For example, the pumping device 200 may provide the underfill solution S to the dispenser nozzle 210.

The underfill solution supplying device 100 may include a syringe container 110, a plunger 120, a cap 130, a first gas supply line 310 and a second gas supply line 410.

For example, the syringe container 110 may have a substantially cylindrical body for receiving the underfill solution S. The syringe container 110 may include an open end portion and a fluid dispensing end portion. The open end portion may be an upper end portion of the syringe container 110, and the fluid dispensing end portion may be a lower end portion of the syringe container 110. The fluid dispensing end portion may have an injection hole 102 through which the underfill solution S within the syringe container 110 is discharged to the outside, e.g., to a fluid supply line 140. For example, the syringe container 110 may be a container receiving the underfill solution S. For example, the syringe container 110 may be a cylindrical tube and/or a barrel of a syringe. The syringe container 110 may have a length direction extending from the open end to the fluid dispensing end connected to a fluid supply line. The syringe container may be symmetrical about an axis extending along the length direction.

The plunger 120 may be disposed movably within the syringe container 110. The plunger 120 may be engaged airtightly with an inner wall of the syringe container 110. For example, the plunger 120 may be movably contact with the inner wall of the syringe container 110. A space within the syringe container 110 may be divided into a first chamber C1 and a second chamber C2 by the plunger 120. The first chamber C1 may be defined between a lower end portion of the plunger 120 and the fluid dispensing end portion, and the second chamber C2 may be defined between an upper end portion of the plunger 120 and the open end portion. The plunger 120 may be positioned on a surface of the underfill solution S received within the syringe container 110. Accordingly, the underfill solution S may be received within the first chamber C1 under the plunger 120.

As illustrated in FIG. 3, the plunger 120 may include a cylindrical outer body engaged (e.g., contact) airtightly with the inner wall of the syringe container 110, a pressurizing plate 122 provided in a lower portion of the outer body 121 to pressurize the underfill solution S and a gas supply guide 123 extending upwardly from the pressurizing plate 122 and having a through hole 124 therein. For example, the pressurizing plate 122 may be connected to an inner surface of the cylindrical outer body 121 in its lower portion. In certain embodiments, the pressurizing plate 122 may be connected at the bottom of the cylindrical outer body 121 so that the outermost surface of the pressurizing plate 122 may be engaged (e.g., contact) airtightly with the inner wall of the syringe container 110. The pressurizing plate 122 may have a downward convex sectional shape. The pressurizing plate 122 and the outer body 121 may form a pressurizing recess portion R which is in communication with the second chamber C2 to receive a pressure of a first gas for plunger pressurization.

The cap 130 may be engaged airtightly with the open end portion of the syringe container 110. For example, the cap 130 may be attached airtightly with an end of the syringe container 110. For example the cap 130 may seal an open end of the syringe container 110. In certain embodiments, the cap 130 may be irremovably attached at an open end of the syringe container 110 so that the cap 130 may be removed when the syringe container 110 is cleaned and/or when an underfill agent is filled in the syringe container 110. A first through hole 132 may be formed to penetrate through the cap 130. A second through hole 134 may be formed to be spaced apart from the first through hole 132 and to penetrate the cap 130.

The first gas supply line 310 may extend into the syringe container 110 through the first through hole 132. The first gas supply line 310 may be used as a passage through which a first gas A1 is supplied into the syringe container 110 through the first through hole 132 of the cap 130. Alternatively, the first gas supply line 310 may be combined with the first through hole 132. For example, an end portion of the first gas supply line 310 may be combined with an upper end portion of the first through hole 132 such that the first gas A1 may be supplied into the syringe container 110 through the first through hole 132. In certain embodiments, the end portion of the first gas supply line 310 may reach to a portion between the upper end portion and a lower end portion of the first through hole 132.

The first gas supply line 310 may be connected to a first gas supply portion 300. The first gas supply portion 300 may supply the first gas A1 having a predetermined pressure into the second chamber C2 of the syringe container 110 through the first gas supply line 310. For example, the pressure of the first gas A1 may be about 50 Mpa. For example, the pressure of the first gas A1 may be between 40 Mpa and 60 Mpa. A first pressure control valve 320 and a check valve 330 may be installed in respective portions of the first gas supply line. The controller 30 may output a control signal to the first pressure control valve 320 to maintain the first gas A1 at a desired pressure. For example, the check valve 330 may be a one-way valve controlling flow of the first gas A1 from the first pressure control valve side toward the second chamber C2.

The second gas supply line 410 may extend into the syringe container 110 through the second through hole 134. The second gas supply line 410 may extend from the cap 130 through the plunger 120 and may be used as a passage through which a second gas A2 is supplied into the underfill solution S through the through hole 124 of the plunger 120. Alternatively, the second gas supply line 410 may be combined with the through hole 124 of the plunger 120. For example, an end portion of the second gas supply line 410 may be combined with an upper end portion of the through hole 124 such that the second gas A2 may be supplied into the syringe container 110 through the through hole 124. In certain embodiments, the end portion of the second gas supply line 410 may reach to a portion between the upper end portion and a lower end portion of the through hole 124 of the plunger 120.

For example, the second gas supply line 410 may have a flexible structure and/or may include flexible material so that the second gas supply line 410 is connected to the plunger 120 and the end portion of second gas supply line 410 moves along with the plunger 210 while the plunger 120 moves up and down, e.g., along a length direction of the syringe container 110. Since the end portion of the second gas supply line 410 moves along with the plunger 120, the second gas supply line 410 may have a sufficient length within the syringe container 110.

The second gas supply line 410 may be connected to a second gas supply portion 400. The second gas supply portion 400 may supply the second gas A2 having a predetermined pressure into the first chamber C1 of the syringe container 110 through the second gas supply line 410. For example, the pressure of the second gas A2 may be about 50 Mpa. For example, the pressure of the second gas A2 may be between 40 Mpa and 60 Mpa. A second pressure control valve 420 and a solenoid valve 430 may be installed in respective portions of the second gas supply line. The controller 30 may output a control signal to the second pressure control valve 420 and the solenoid valve 430 to maintain the second gas A2 at a desired pressure and a desired flow rate. For example, the solenoid valve 430 may be controlled by an electric current and may control a flow of the second gas A2 from the second pressure control valve side toward the first chamber C1.

The underfill solution supplying device 100 may further include a fluid supply line 140 which is connected to the injection hole 102 of the fluid dispensing end portion to supply the underfill solution S to the pumping device 200.

As illustrated in FIGS. 4A and 4B, as the first gas A1 is supplied into the second chamber C2 of the syringe container 110 through the first gas supply line 310, the plunger 120 may pressurize the underfill solution and supply the underfill solution S to the pumping device 200 through the fluid supply line 140. As the second gas A2 is supplied into the first chamber C1 of the syringe container 110 through the second gas supply line 410, the second gas A2 may be dissolved in the underfill solution S.

Because the underfill solution S is pressurized by the plunger 120 to have a relatively high pressure, gas solubility may be increased. Accordingly, the second gas A2 may be dissolved easily in the underfill solution S. The dissolved second gas A2 may be trapped as a bubble B within the underfill solution S. The underfill solution having the trapped second gas, for example, air bubbles, may be supplied to the pumping device 200. For example, the second gas A2 may form a bubble B within the underfill solution S and/or may be dissolved into the underfill solution S.

The pumping device 200 may dispense the supplied underfill solution S through the dispenser nozzle 210 using a jet pump manner, a cylinder manner, a ball screw manner, etc. As will be mentioned later, after the underfill solution S is dispensed on the printed circuit board, the underfill solution S may be cured to form a sealing member, while the air dissolved in the underfill solution S may form a void within the sealing member. The void may reduce or prevent a progress of a crack generated by a difference of coefficients of thermal expansion (CTE) between the sealing member and adjacent structures, e.g., semiconductor chips, package substrates and/or module boards, to thereby improve temperature cycle (TC) reliability.

Hereinafter, a method of manufacturing a semiconductor module using the dispenser of FIG. 1 will be explained. The method of manufacturing the semiconductor module may be used to mount semiconductor packages on a module board. However, it may not be limited thereto, and for example, the manufacturing method may be used to mount semiconductor chips on a package substrate.

Figure 5:
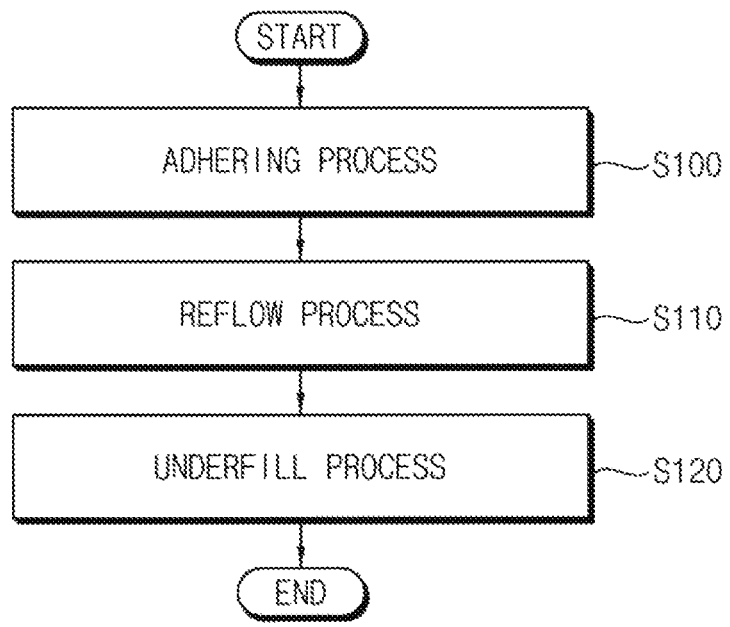
Figure 6:
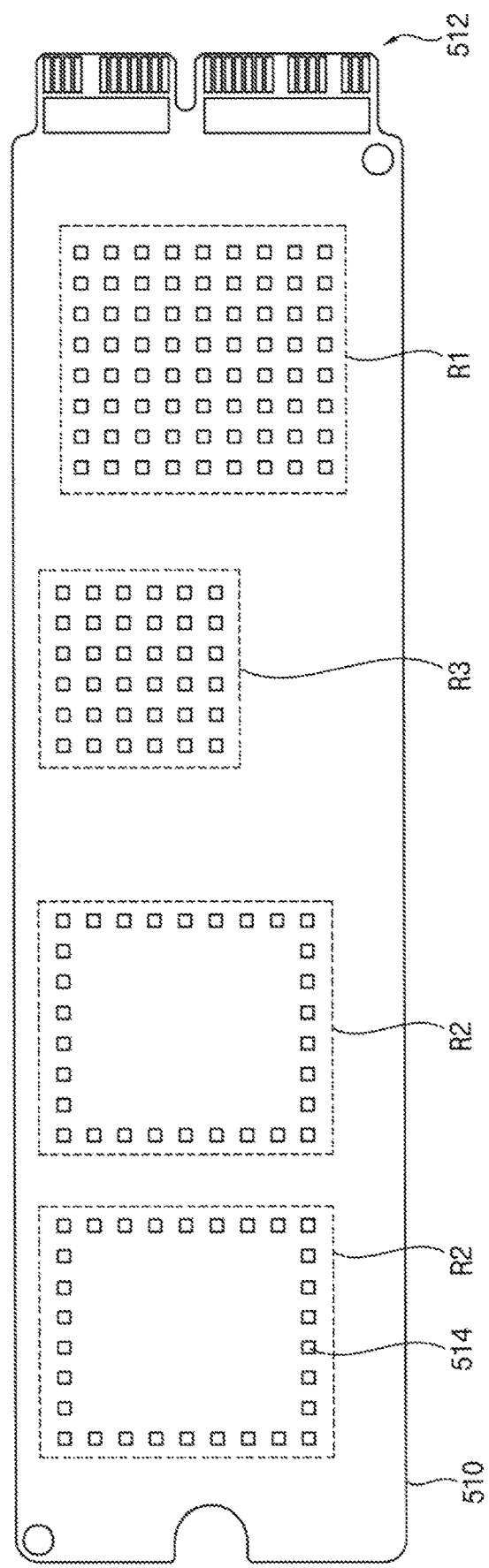
Figure 7:
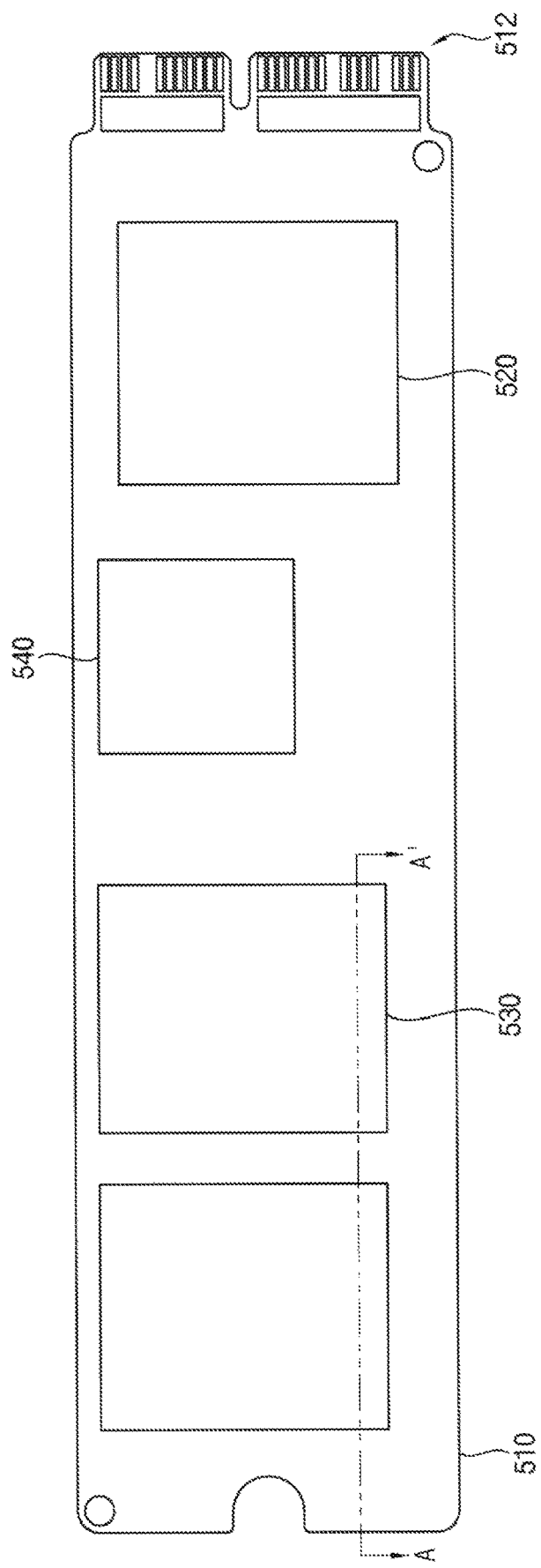
Figure 8:
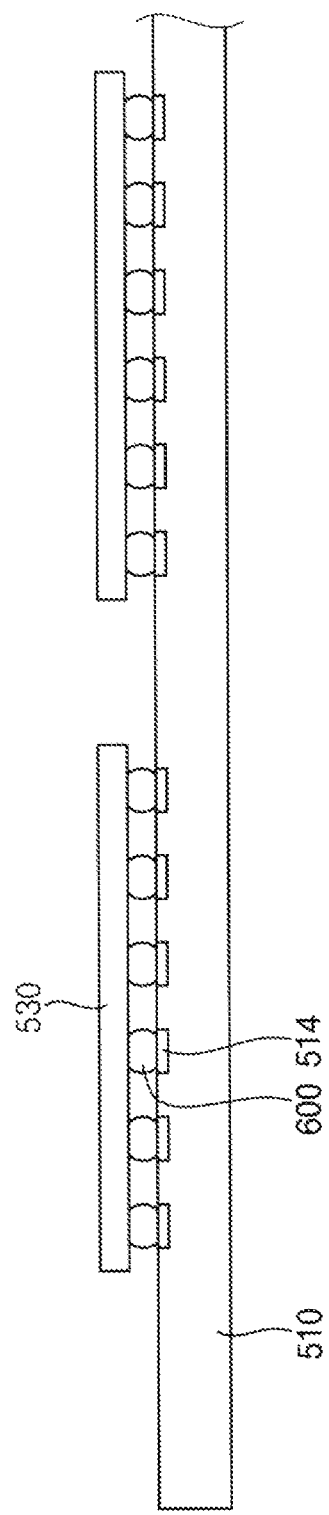

FIG. 5 is a flow chart illustrating a method of manufacturing a semiconductor module in accordance with example embodiments. FIGS. 6 to 9 are views illustrating a method of manufacturing a semiconductor module in accordance with example embodiments. FIG. 10 is an enlarged view illustrating "A" portion in FIG. 9. FIG. 8 is a cross-sectional view taken along the line A-A' in FIG. 7.

Referring to FIGS. 5 to 8, first, electronic products 520, 530 and 540 may be adhered onto a module board 510 (S100), and then, a reflow process may be performed (S110).

In example embodiments, the module board 510 may be a single-layered or multi-layered circuit substrate having an upper surface and a lower surface opposite to each other. For example, the module board 510 may be a printed circuit board (PCB). The PCB may include wirings and vias connected to the wirings. The wirings may include printed circuit patterns for interconnection with the electronic products.

The module board 510 may extend in a first direction (longitudinal direction). The module board 510 may have a rectangular or square shape. The module board 510 may include a first side portion and a second side portion opposite to each other. A connector 512 having connection terminals for connection with a host system (not illustrated) may be provided in the first side portion of the module board 510. Alternatively, the connector 512 may be provided in a third side portion between the first side portion and the second side portion of the module board 510.

In example embodiments, the electronic products may include an SSD controller 520, non-volatile memory devices 530 and a buffer memory device 540. The electronic products may be mounted on the module board 510 in the first direction to be provided as solid state drive (SSD). The SSD may be used to replace a hard disk in a PC, notebook, etc. The SSD may be used in a mobile device such as smart phone, tablet PC, digital camera, MP3 player, PDA, etc.

Mounting regions R1, R2, R3 may be defined on the upper surface or the lower surface of the module board 510. Substrate pads 514 may be arranged in the mounting regions R1, R2, R3. Solder pasted may be printed on the substrate pads 514, e.g., by a screen printing method. Solder on input/output pads of the SSD controller 520, the non-volatile memory devices 530 and the buffer memory device 540 may make contact with the solder paste. Then, the reflow process may be performed on the solders to form solder bumps 600 such that the substrate pads 314 and the input/output pads may be mechanically and electrically connected to each other through the solder bumps 600.

The solder paste may include a solder powder and a flux. The flux may include a resin, a solvent, an antioxidant and an activator. When the flux is selectively heated by the reflow process, the solder may melt together.

Figure 9:
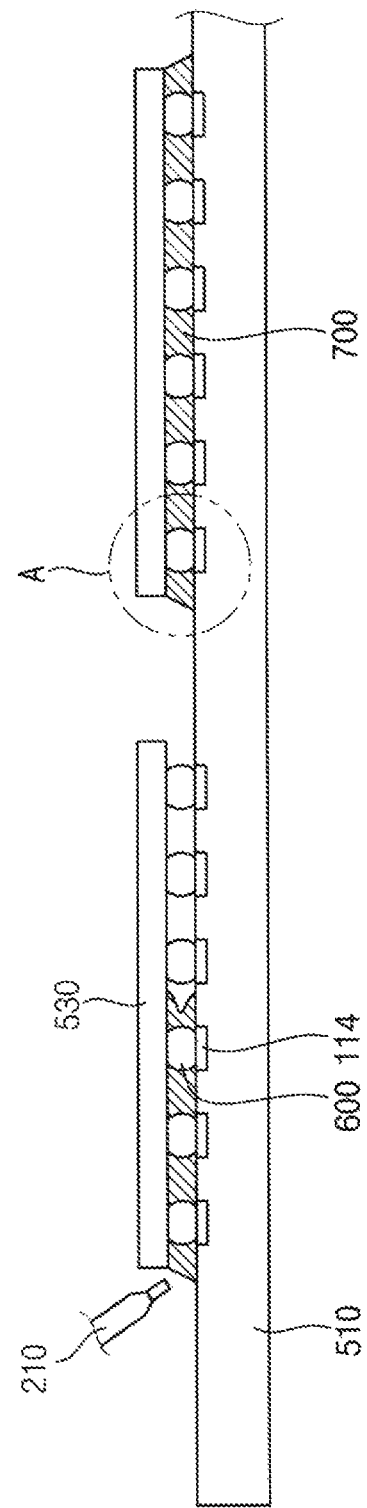
Figure 10:
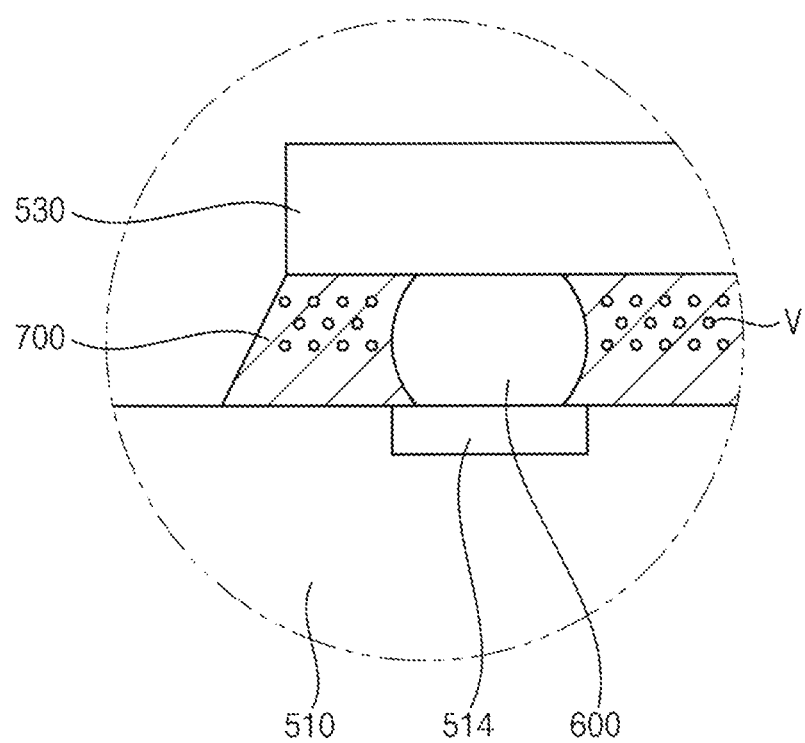

Referring to FIGS. 9 and 10, an underfill process may be performed using the dispenser 20.

In example embodiments, an underfill solution S may be supplied into the syringe container 110 in FIG. 1, and then, a gas (A2) may be introduced into the underfill solution S through the through hole 124 of the plunger 120. After the plunger 120 pressurizes the underfill solution S to supply the underfill solution S having the gas (A2) trapped and/or dissolved therein to the pumping device 200, the dispenser nozzle 210 may dispense the underfill solution S between the electronic products 520, 530 and/or 540 and the module board 510. The underfill solution S may be moved between the electronic products 520, 530 and/or 540 and the module board 510 by a capillary action, and then, the underfill solution S may be cured to form a sealing member 700.

As illustrated in FIG. 10, the air (B) dissolved and/or trapped in the underfill solution S may be transformed into a void V within the sealing member under atmospheric pressure. The void V may reduce or prevent a progress of a crack generated from the flux by a difference of coefficients of thermal expansion (CTE) between the sealing member and adjacent structures, e.g., semiconductor chips, package substrates and/or module boards, to thereby improve temperature cycle (TC) reliability.

Certain embodiments of the present disclosure may include a semiconductor device (e.g., a semiconductor package or a semiconductor module) manufactured by a method disclosed in the previous embodiments. For example, in certain embodiments, a semiconductor package may include a package substrate, a semiconductor chip mounted on the package substrate, and an underfill agent disposed between the semiconductor chip and the package substrate. The underfill agent may include voids or bubbles inside the underfill agent. For example the underfill agent may be an insulation layer filled between the semiconductor chip and the package substrate, e.g., after the mounting of the semiconductor chip on the package substrate. In certain embodiments, a semiconductor module may include a module board, a semiconductor package mounted on the module board, and an underfill agent disposed between the semiconductor package and the module board. The underfill agent may be an insulation layer filled between the semiconductor package and the module board, e.g., after the semiconductor package is mounted on the module board. The underfill agent may include voids or bubbles inside the underfill agent.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A dispenser, comprising:
   a syringe container having a first end and a second end, the syringe container having a length direction extending between the first end and the second end;
   a plunger movable within the syringe container along the length direction of the syringe container and configured to be positioned on a surface of an underfill solution to be received within the syringe container at a first region between the plunger and the second end;
   a cap attached airtightly to the first end of the syringe container;
   a first gas supply line configured to supply a first gas into the syringe container through the cap; and
   a second gas supply line extending from the cap to the plunger, the second gas supply line being in fluid communication with the first region and configured to supply a second gas into the underfill solution to be received within the syringe container at the first region through a through hole of the plunger.

2. The dispenser of claim 1, wherein the first gas supply line extends into the syringe container through a first through hole of the cap.

3. The dispenser of claim 1, wherein the second gas supply line extends into the syringe container through a second through hole of the cap.

4. The dispenser of claim 3, wherein the second gas supply line is engaged with the through hole of the plunger.

5. The dispenser of claim 4, wherein the second gas supply line extends through the through hole of the plunger.

6. The dispenser of claim 1, wherein the plunger comprises:
   a cylindrical outer body engaged airtightly with an inner wall of the syringe container;
   a plate provided in a lower portion of the cylindrical outer body, the plate configured to pressurize the underfill solution; and
   a gas supply guide extending upwardly from the plate and having the through hole therein.

7. The dispenser of claim 6, wherein the plate and the cylindrical outer body forms a recess which is configured to receive the first gas.

8. The dispenser of claim 1, further comprising a fluid supply line connected to an injection hole, the injection hole formed at the second end, the fluid supply line configured to supply the underfill solution to a pump of the dispenser.

9. The dispenser of claim 1, further comprising a check valve installed in the first gas supply line, the check valve configured to control a flow of the first gas.

10. The dispenser of claim 1, further comprising a solenoid valve installed in the second gas supply line, the solenoid valve configured to control a flow of the second gas.

11. The dispenser of claim 1, further comprising:
    an injection hole formed in the second end of the syringe container; and
    a fluid supply line connected to the injection hole to supply the underfill solution from the syringe container to a pumping device.

12. A dispenser, comprising:
    a syringe container configured to receive an underfill solution;
    a plunger movable within the syringe container along a length direction of the syringe container and configured to pressurize the underfill solution to be received within the syringe container at a first region;

a cap attached airtightly to a first end of the syringe container; and a first gas supply line extending to the plunger through the cap, the first gas supply line being in fluid communication with the first region and configured to supply a first gas for bubble formation into the underfill solution to be received within the syringe container at the first region through a through hole of the plunger.

13. The dispenser of claim 12, wherein the first gas supply line extends into the syringe container through a through hole of the cap.

14. The dispenser of claim 12, further comprising a second gas supply line extending into the syringe container through the cap and configured to supply a second gas for plunger pressurization.

15. The dispenser of claim 14, further comprises:

an injection hole formed in a second end of the syringe container, the syringe container having a length direction extending between the first end and the second end; and a fluid supply line connected to the injection hole to supply the underfill solution from the syringe container to a pumping device.

16. The dispenser of claim 12, wherein the plunger comprises a cylindrical outer body engaged airtightly with an inner wall of the syringe container;

a plate provided in a lower portion of the cylindrical outer body to pressurize the underfill solution; and a gas supply guide extending upwardly from the plate and having the through hole of the plunger.

17. The dispenser of claim 12, further comprising a fluid supply line connected to a hole of the syringe container, the hole formed at a second end of the syringe container opposite to the first end of the syringe container, the fluid supply line configured to supply the underfill solution to a pump of the dispenser, wherein the pump is configured to dispense the underfill solution outside the dispenser through a dispenser nozzle.

* * * * *